United States Patent
Nikoonahad et al.

(10) Patent No.: US 6,710,876 B1
(45) Date of Patent: Mar. 23, 2004

(54) METROLOGY SYSTEM USING OPTICAL PHASE

(75) Inventors: Mehrdad Nikoonahad, Menlo Park, CA (US); Guoheng Zhao, Milpitas, CA (US); Ian Smith, Los Gatos, CA (US); Mehdi Vaez-Iravani, Los Gatos, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 352 days.

(21) Appl. No.: 09/639,495

(22) Filed: Aug. 14, 2000

(51) Int. Cl.[7] .............................................. G01B 11/00
(52) U.S. Cl. ........................ 356/401; 356/399; 356/400
(58) Field of Search .................................. 356/399, 400, 356/401, 488, 925; 250/491.1, 548

(56) References Cited

U.S. PATENT DOCUMENTS

| | | | | |
|---|---|---|---|---|
| 4,710,026 A | * | 12/1987 | Magome et al. | 356/488 |
| 5,171,999 A | * | 12/1992 | Komatsu et al. | 250/548 |
| 5,216,257 A | | 6/1993 | Brueck et al. | |
| 5,333,050 A | * | 7/1994 | Nose et al. | 356/490 |
| 5,689,339 A | * | 11/1997 | Ota et al. | 356/401 |
| 5,712,707 A | | 1/1998 | Ausschnitt et al. | |
| 5,751,426 A | * | 5/1998 | Nose et al. | 356/488 |
| 5,757,507 A | | 5/1998 | Ausschnitt et al. | |
| 5,923,041 A | | 7/1999 | Cresswell et al. | |
| 6,023,338 A | | 2/2000 | Bareket | |
| 6,130,750 A | | 10/2000 | Ausschnitt et al. | |
| 6,294,296 B1 | * | 9/2001 | Weigl | 430/22 |

OTHER PUBLICATIONS

R. Pforr, et al., "In–Process Image Detecting Technique For Determination Of Overlay, And Image Quality For ASM–L Wafer Stepper", *SPIE vol. 1674 Optical/Laser Microlithography V* (1992) pp. 594–608.

* cited by examiner

*Primary Examiner*—Rodney Fuller
(74) *Attorney, Agent, or Firm*—Parsons Hsue & de Runtz LLP

(57) ABSTRACT

Misalignment error between two periodic structures such as two overlay targets placed side-by-side is measured. The two structures are illuminated by coherent radiation and the positive and negative diffraction beams of the input beam by the two structures are detected to discover the optical phase difference between the positive and negative diffraction beams. The misalignment between the two structures may then be ascertained from the phase difference.

52 Claims, 14 Drawing Sheets

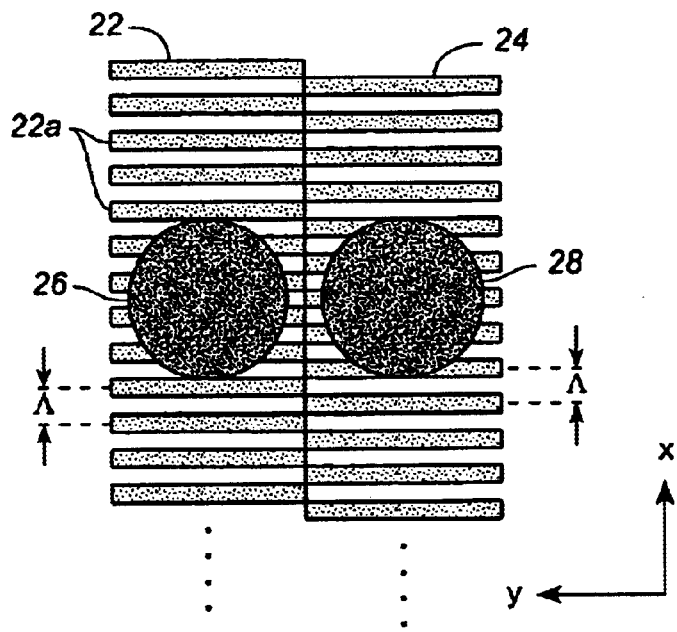
FIG._1
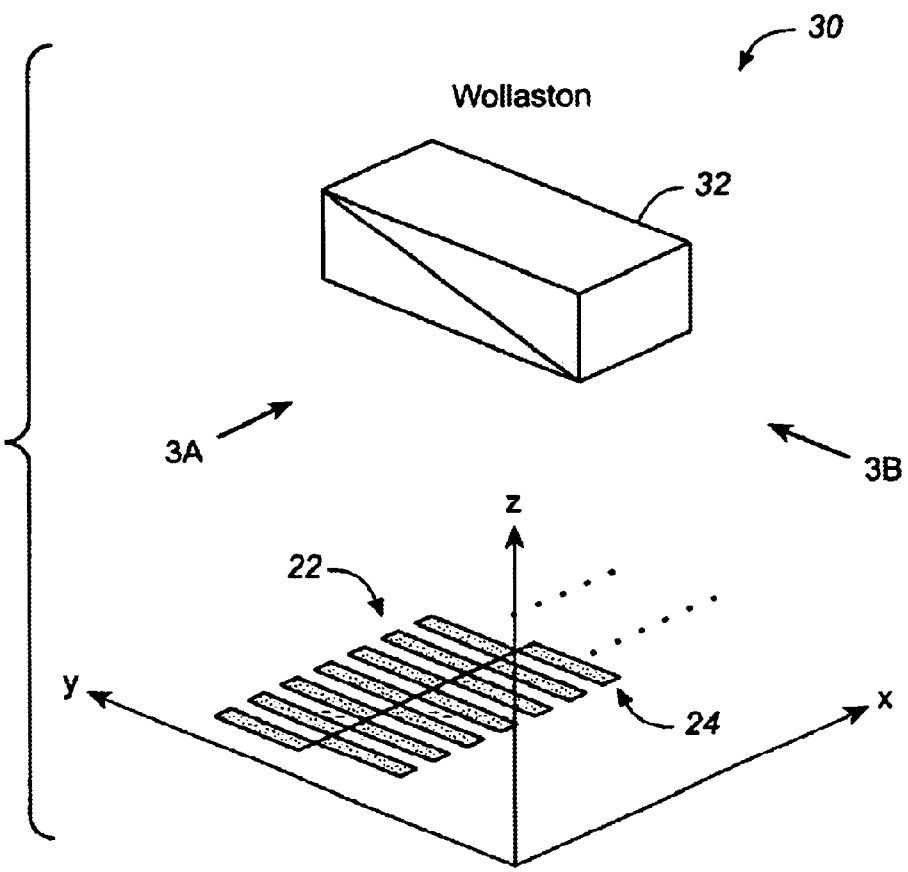
FIG._2

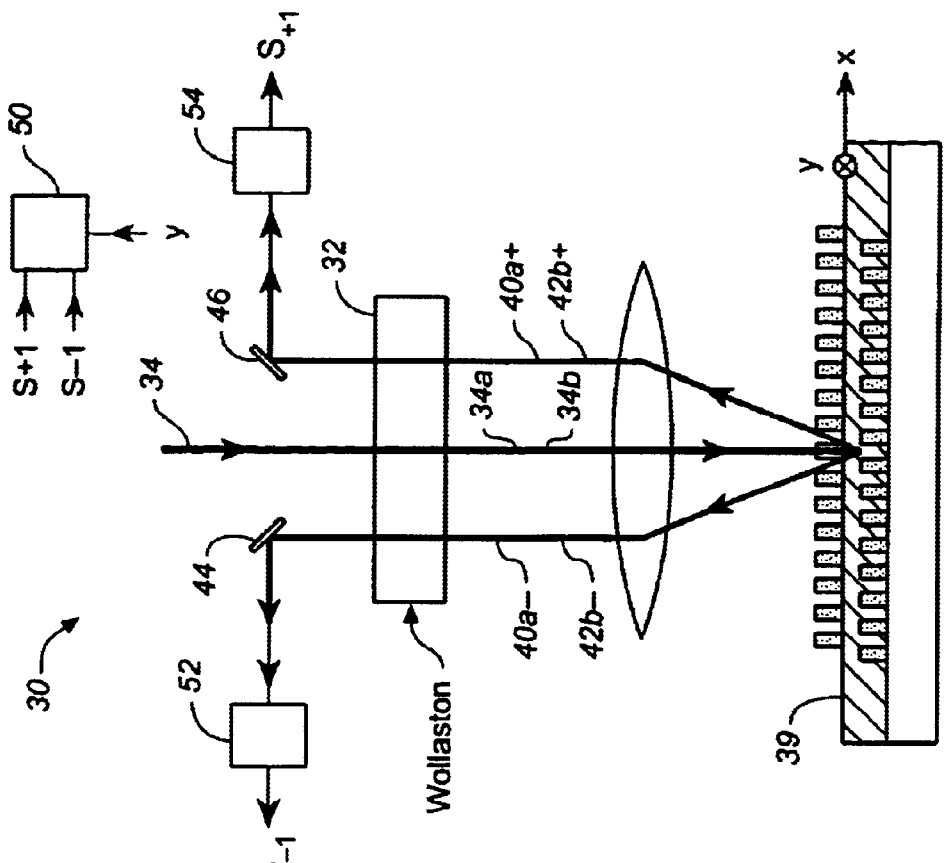
FIG._3B
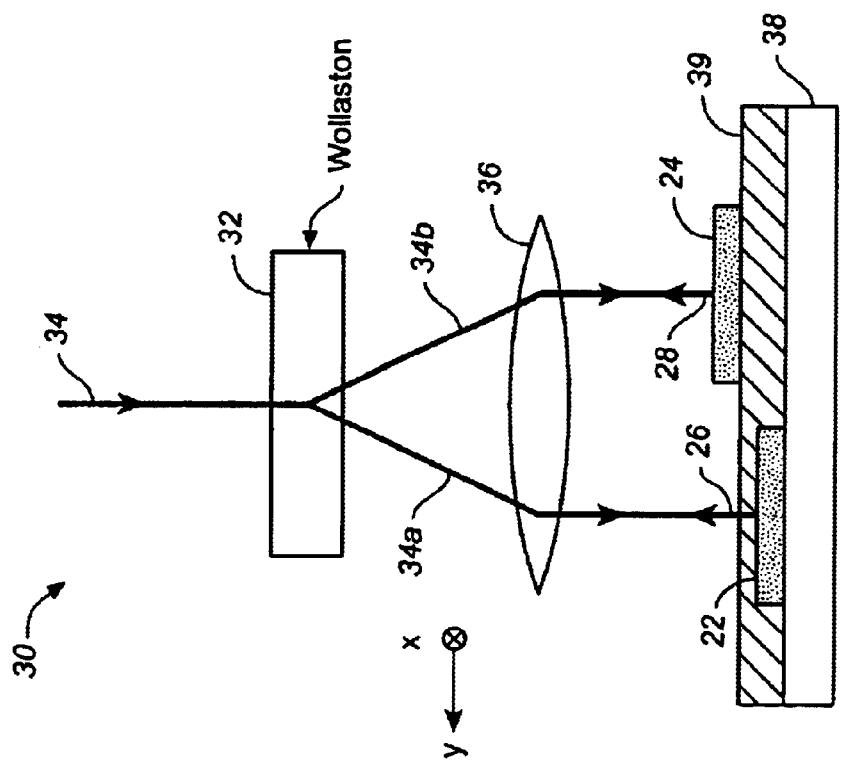
FIG._3A

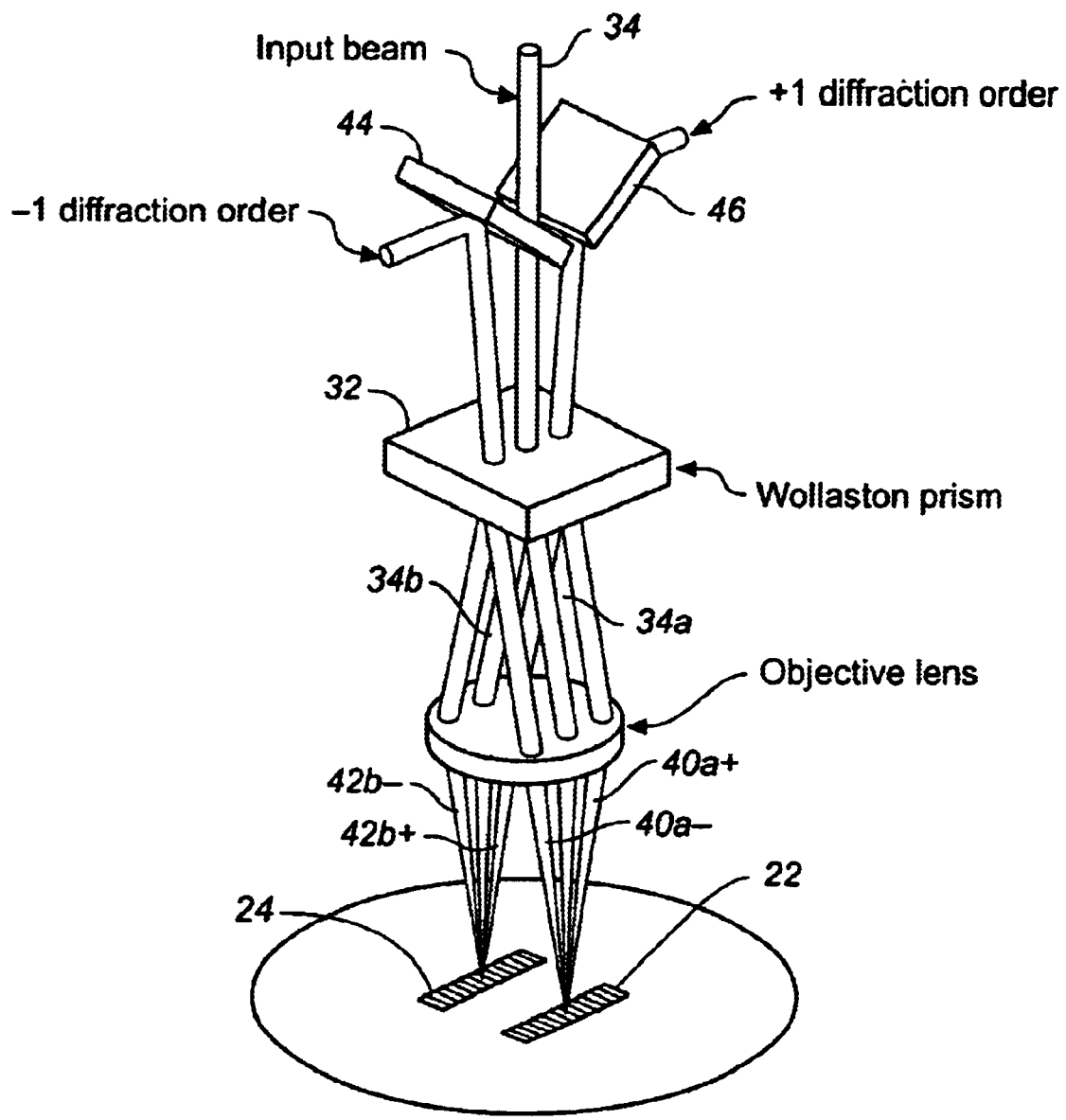
FIG._3C

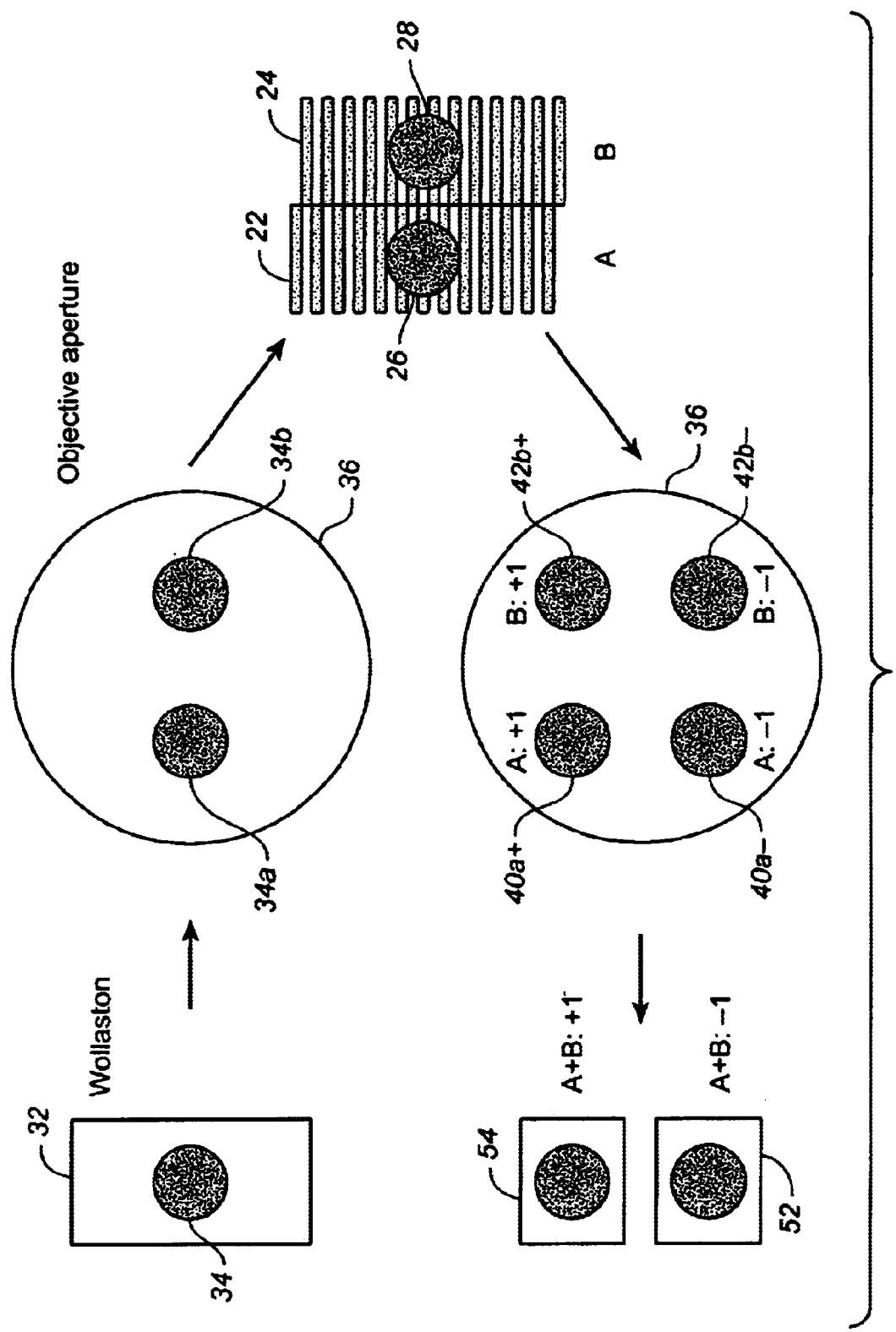
FIG._4

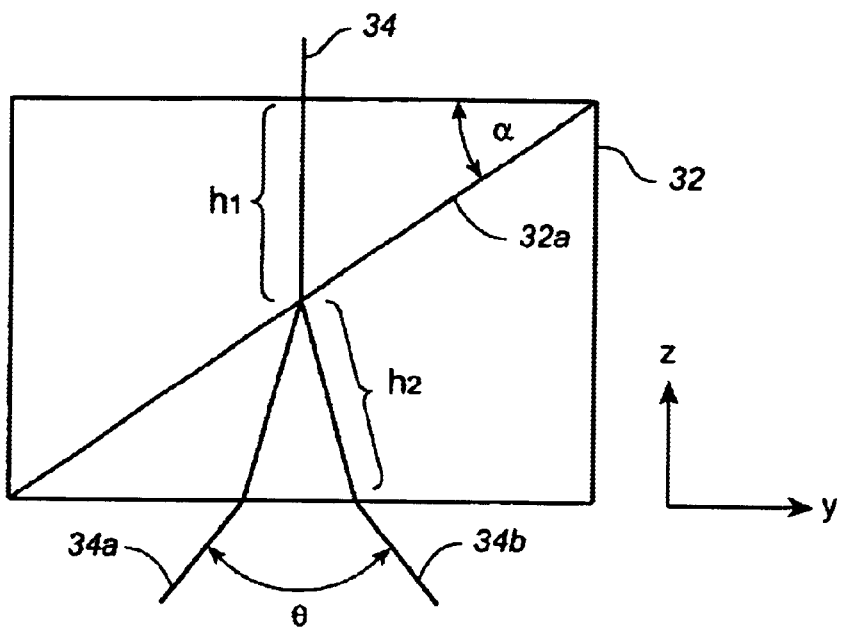
FIG._5
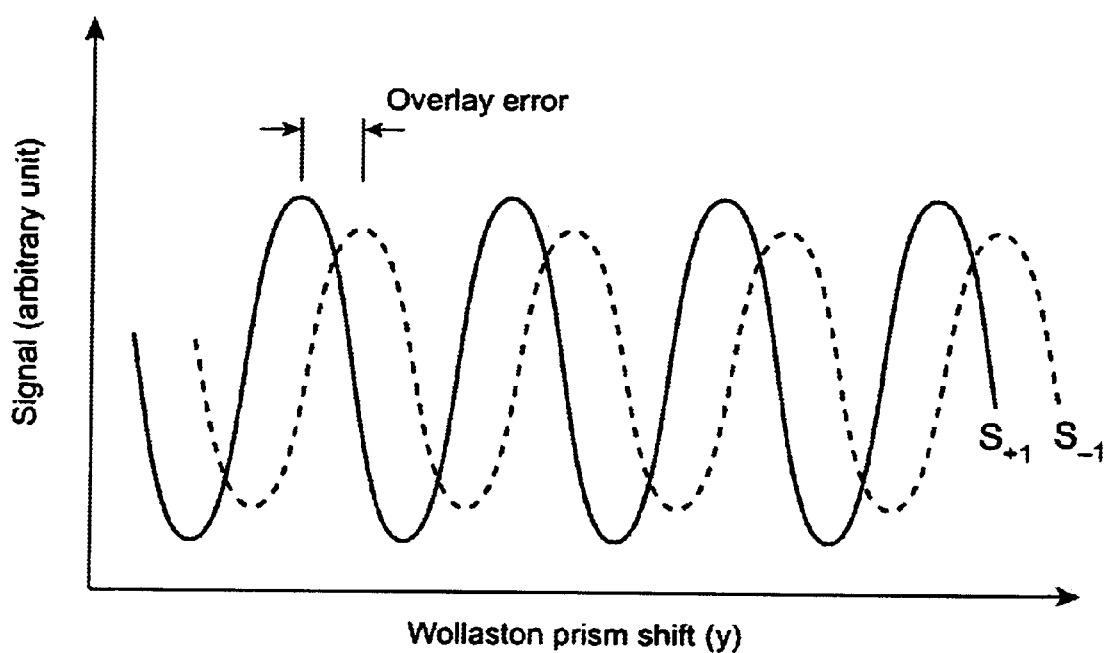
FIG._6

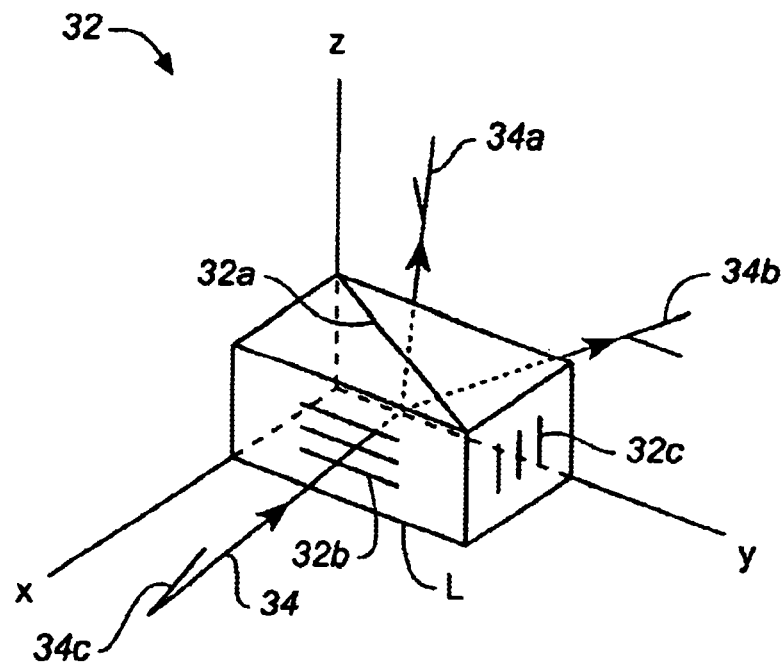
FIG._7A
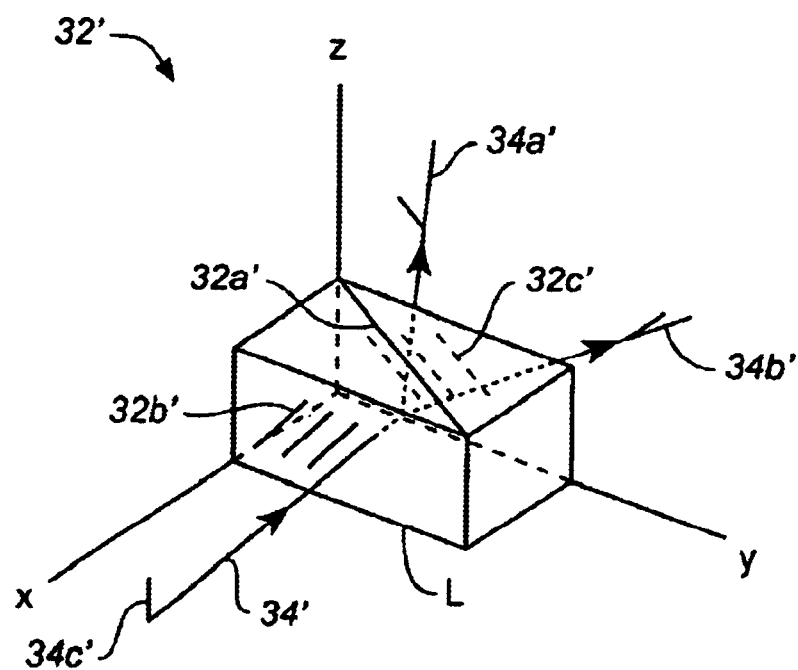
FIG._7B

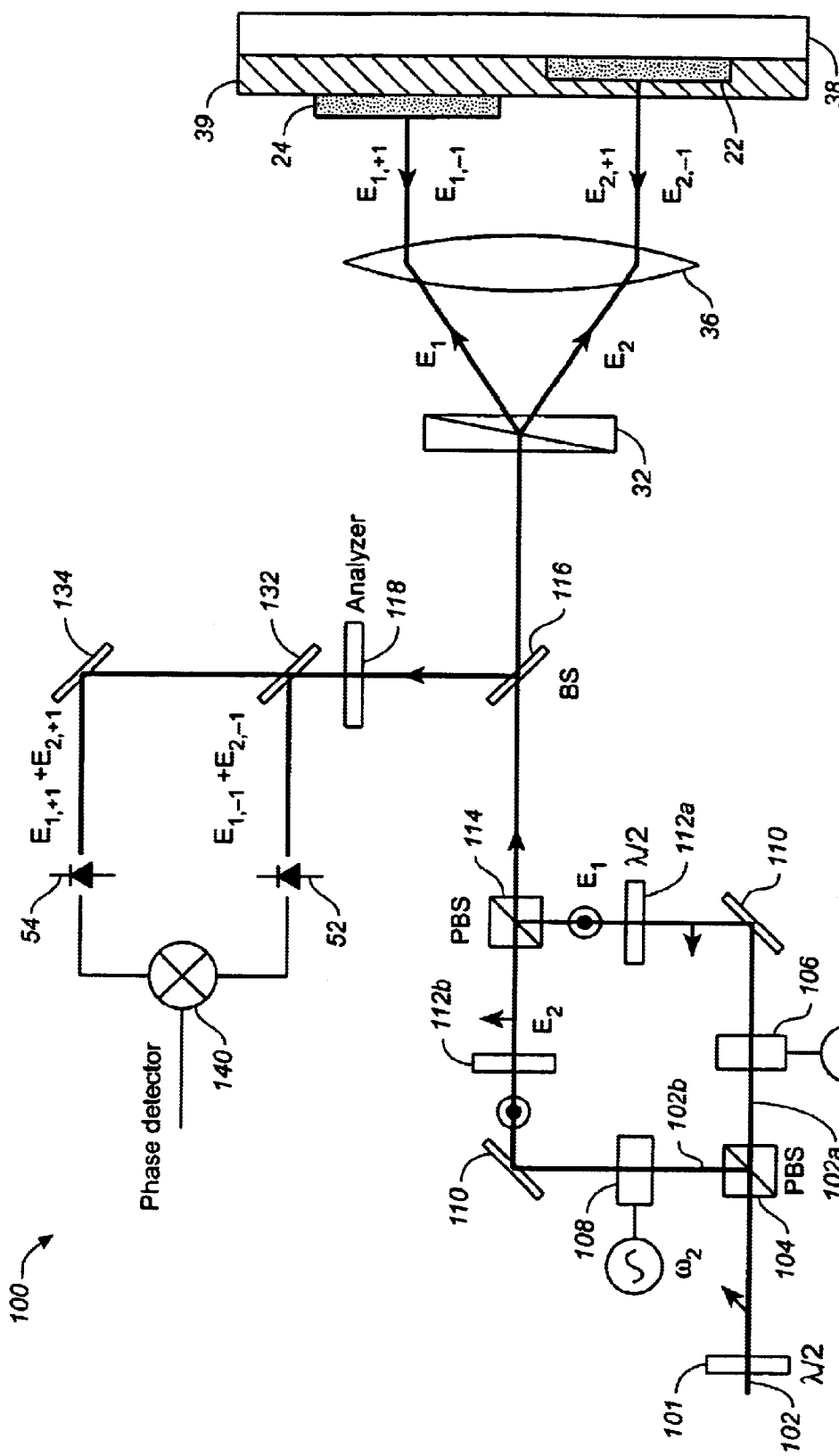
FIG._8A

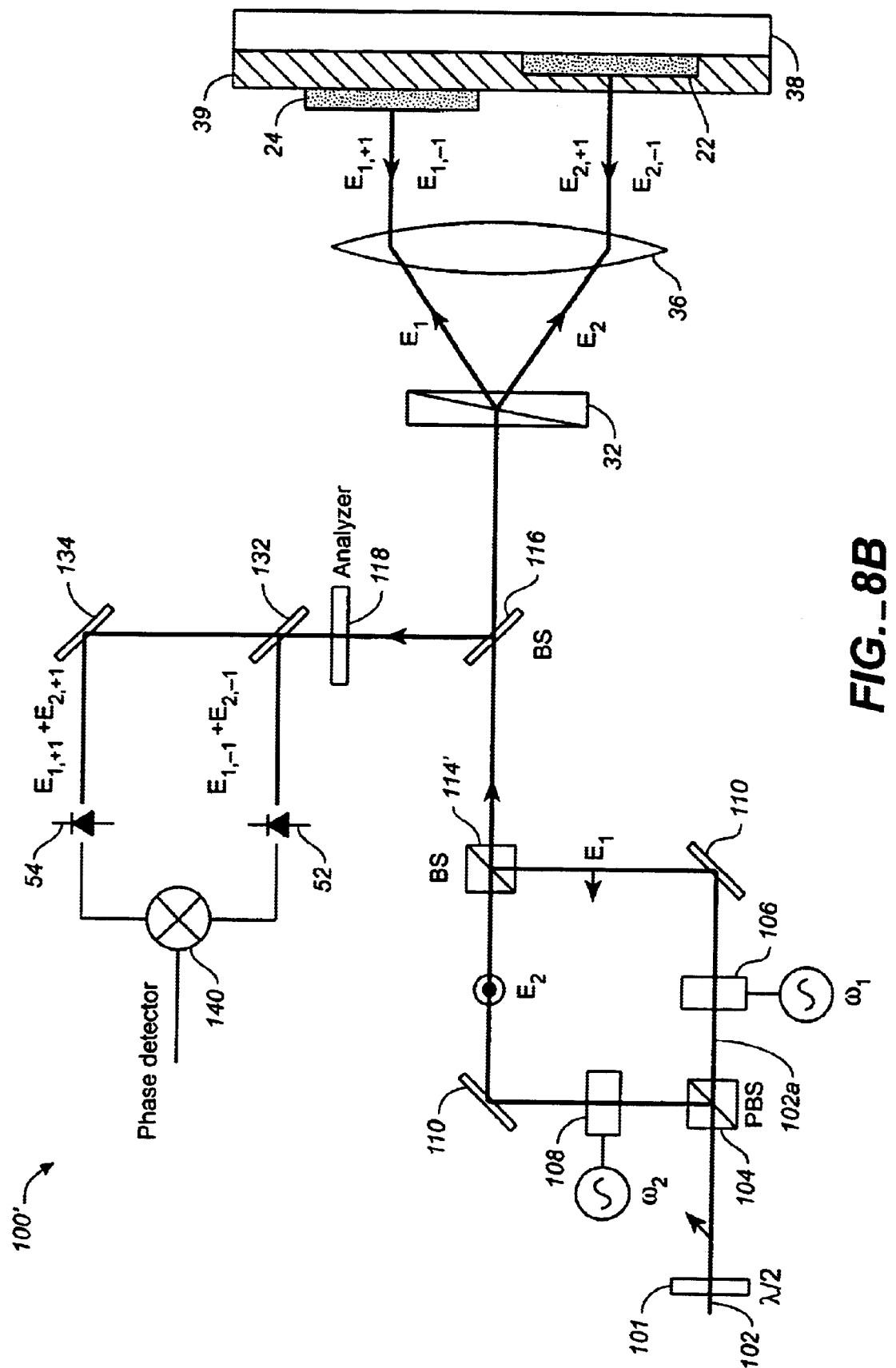
FIG._8B

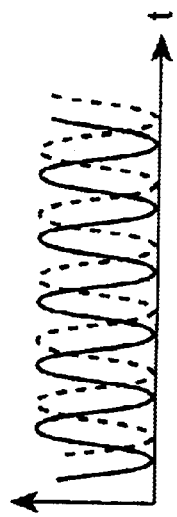
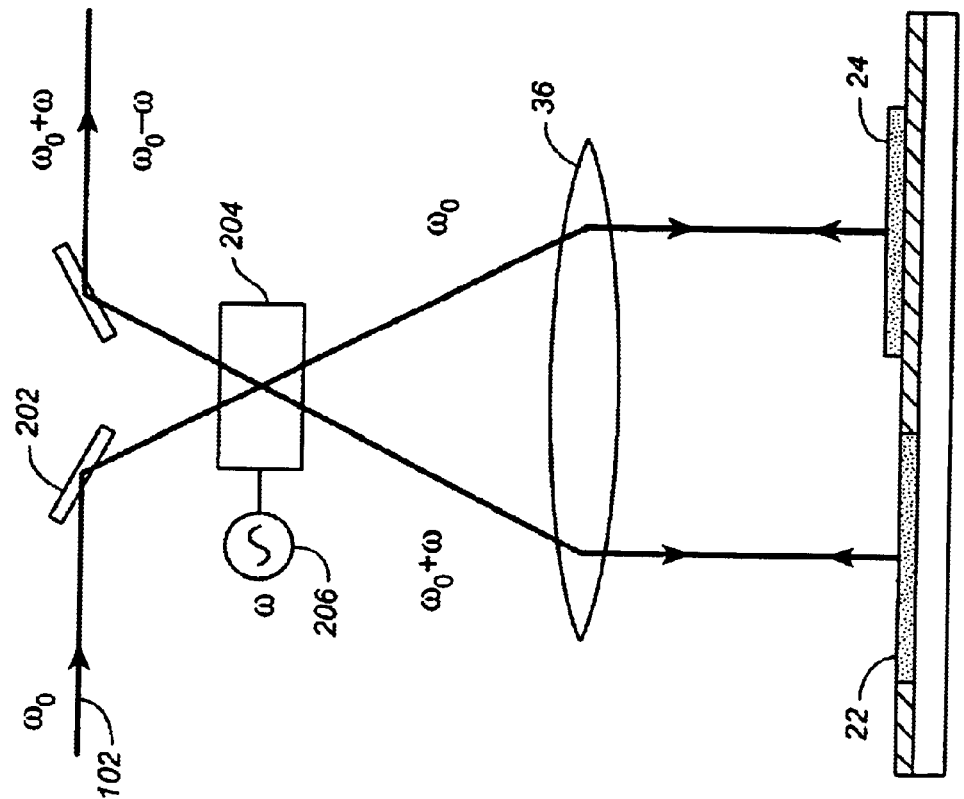
FIG._9B
FIG._9A

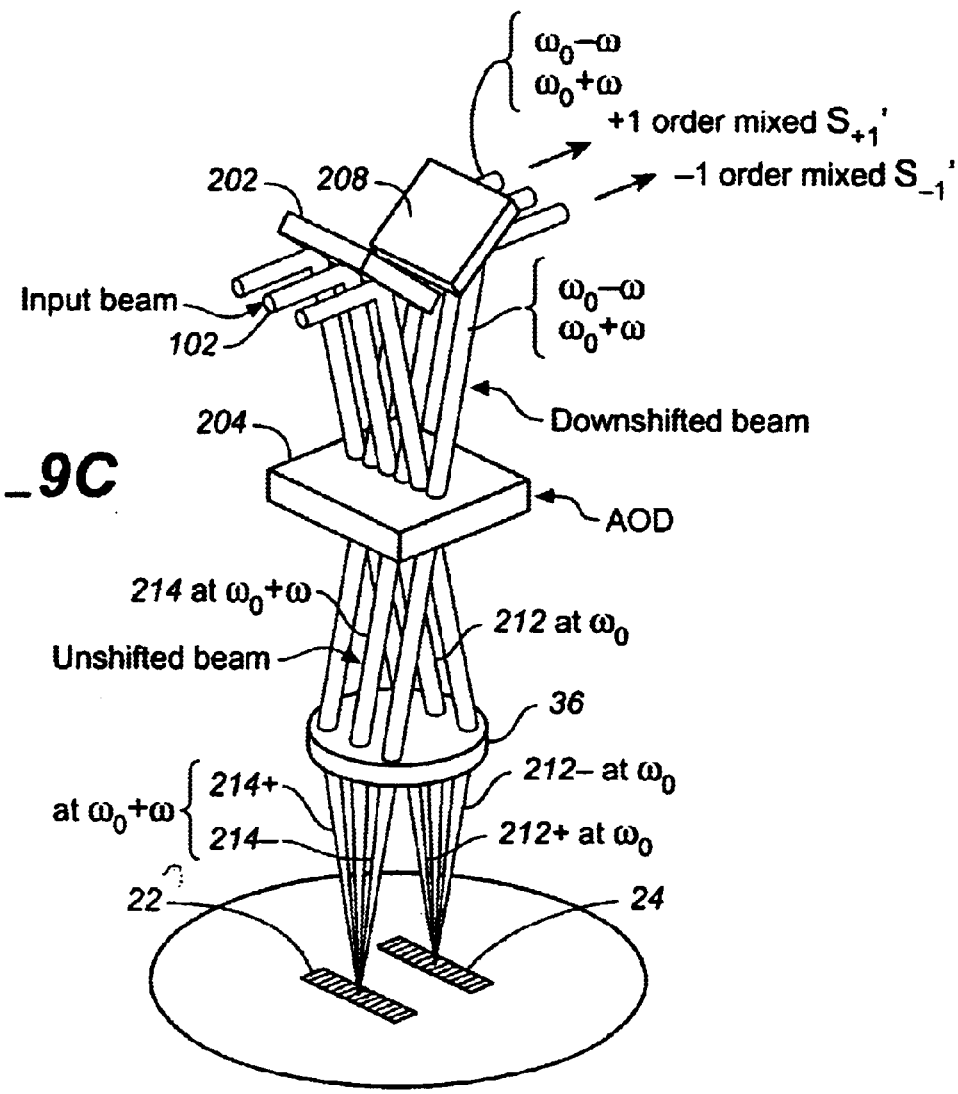
FIG._9C
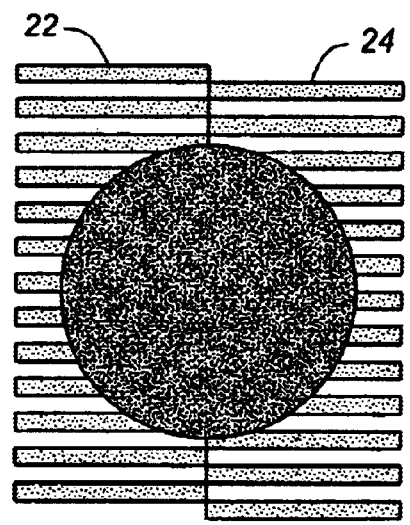
FIG._10

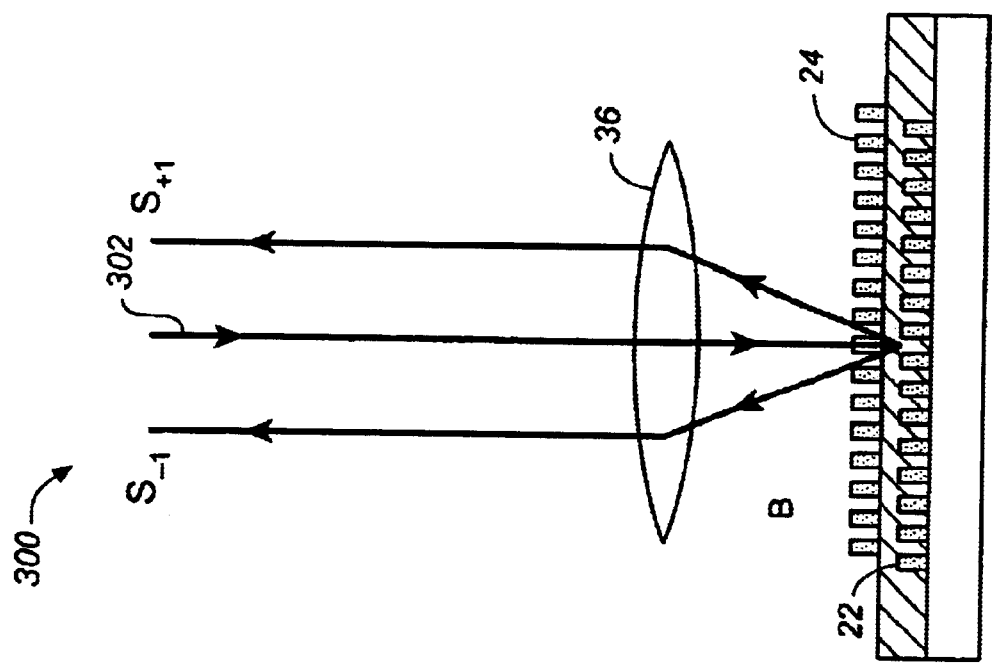
FIG._11B
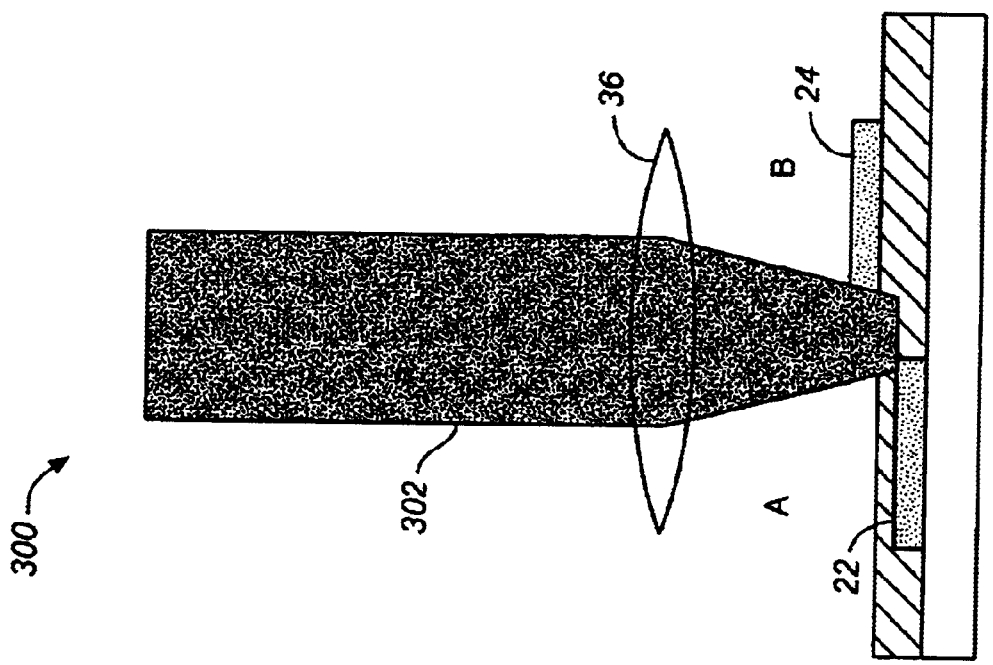
FIG._11A

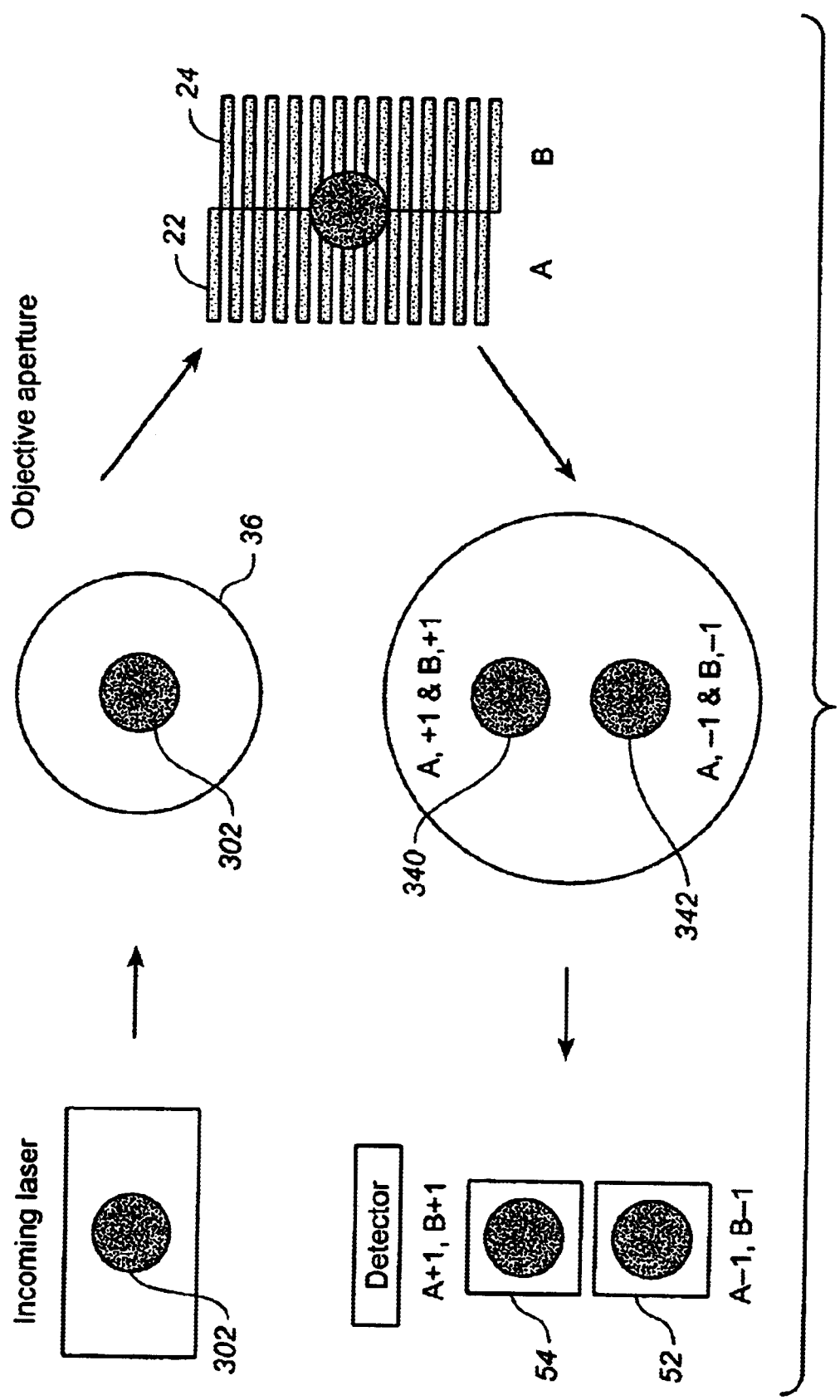
FIG._12

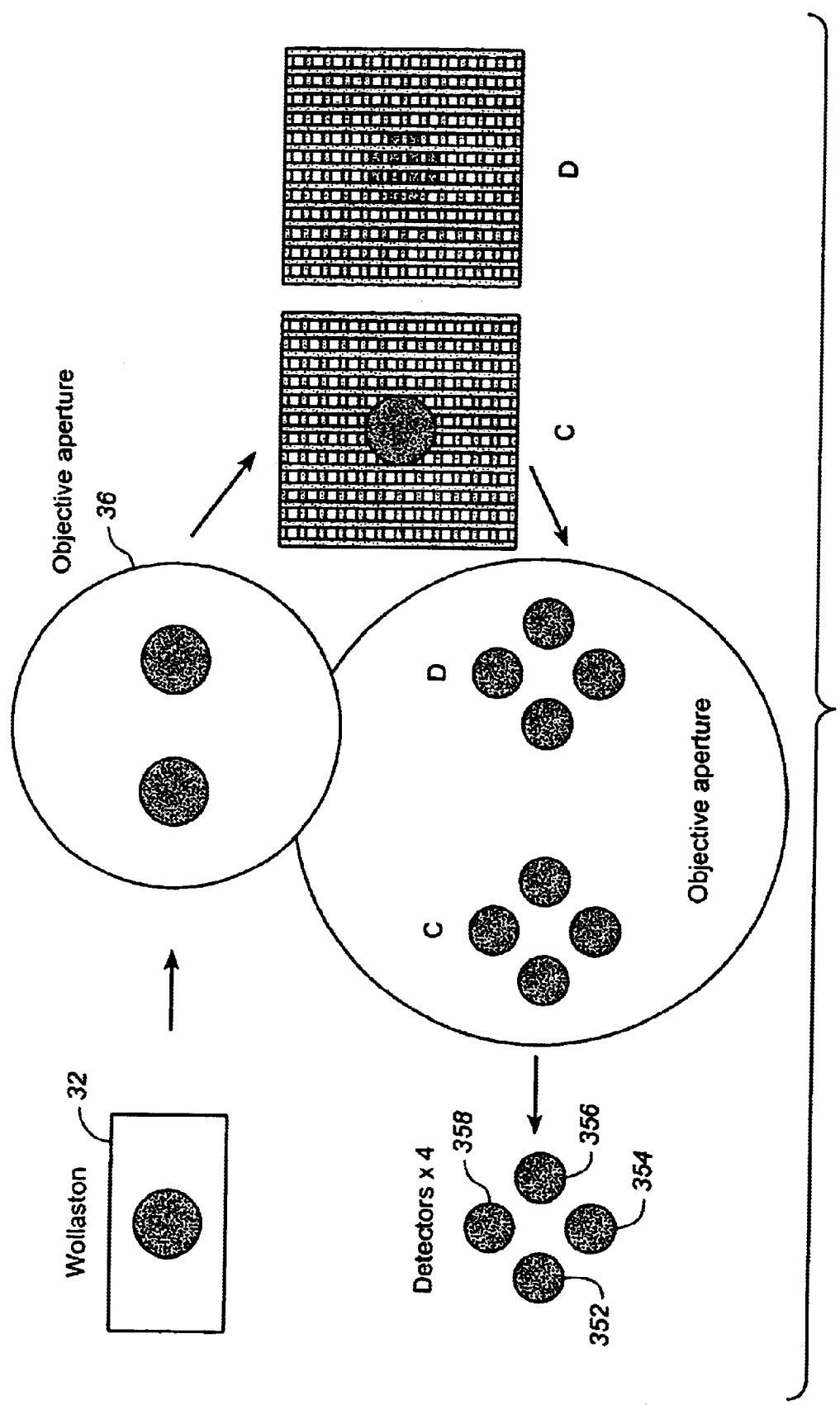
FIG._13

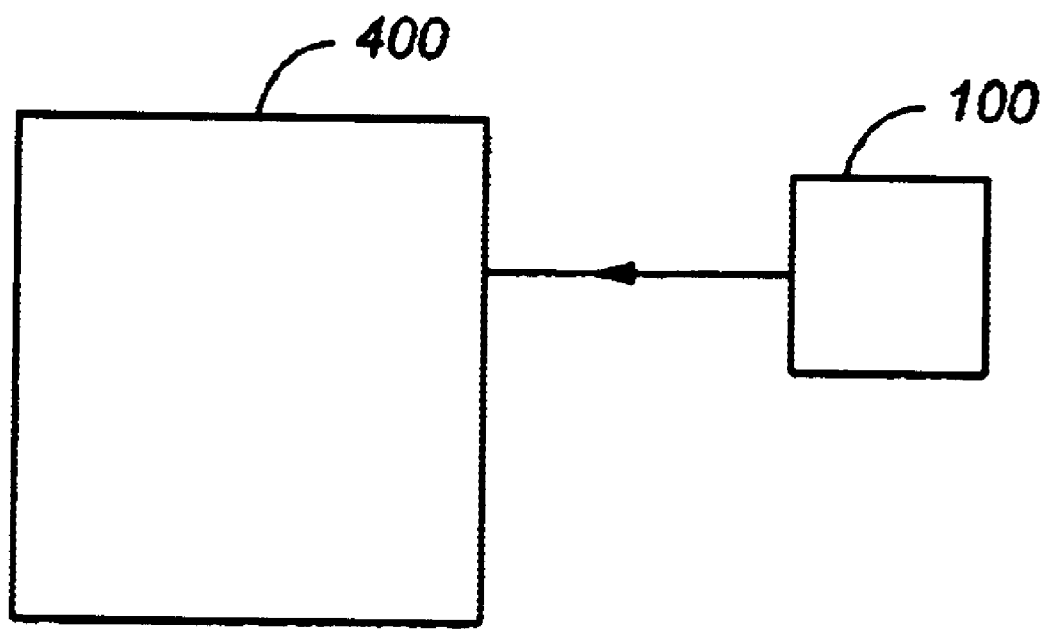
FIG._14

METROLOGY SYSTEM USING OPTICAL PHASE

BACKGROUND OF THE INVENTION

This invention relates in general to metrology systems for measuring periodic structures such as overlay targets employed in photolithography in a research or production environment, and, in particular, to a metrology system employing optical phase for detecting misalignment of such structures.

Overlay error measurement requires specially designed marks to be strategically placed at various locations, normally in the street area between dies, on the wafers for each process. The alignment of the two overlay targets from two consecutive processes is measured for a number of locations on the wafer and the overlay error map across the wafer is analyzed to provide feedback for the alignment control of lithography steppers.

A key process control parameter in the manufacturing of integrated circuits is the measurement of overlay target alignment between successive layers on a semiconductor wafer. If the two overlay targets are misaligned relative to each other, the electronic devices fabricated will malfunction and the semiconductor wafer will need to be reworked or discarded.

Typically, conventional overlay targets are box-in-box targets and bar-in-bar targets. The box-in-box target typically has a 10 μm inner box and a 20 μm outer box. The outer box is printed on the substrate (or previous process layer) and the inner box is resist printed on the current layer. Overlay error is reported as the mis-position of the inner mark with respect to the outer mark. A bar-in-bar target also has a 10 μm inner target on the current layers and a 20 μm outer target on the previous layers. However, the box edge is replaced with a narrow bar 2 μm wide. The box-in-box targets are more compact; however, the bar-in-bar targets provide better measurement performance. Overlay targets may comprise grating structures on top of the wafer or etched into the surface of the wafer. For example, one overlay target may be formed by etching into the wafer while another adjacent overlay target may be a photoresist layer at a higher elevation over the wafer.

Conventional systems for detecting overlay target misalignment typically employs an electronic camera that images the "box-in-box target." The accuracy of the conventional system is limited by the accuracy of the line profiles in the target, by aberrations in the illumination and imaging optics and by the image sampling in the camera. Such methods are complex and they require full imaging optics. Vibration isolation is also required and it may be difficult to integrate such systems into process equipment.

An improvement to the conventional method is described in U.S. Pat. No. 6,023,338. This patent discloses a method where two overlay target structures are placed next to each other and two radiation beams are scanned in two separate paths across portions of both structures. The intensity of the radiation reflected along both paths are detected and processed to calculate any offset between the two structures.

While the above-described improved method may be useful for some applications, it requires beams to be scanned across periodic structures such as overlay targets. It is desirable to develop an improved system with better performance and simplified scanning characteristics.

SUMMARY OF THE INVENTION

This invention is based on the observation that by utilizing optical phase detection, high sensitivity for detecting misalignment of periodic structures can be achieved. Thus, two periodic structures such as overlay targets are placed side-by-side so that they are periodic substantially along the same direction, where portions of both structures are illuminated by coherent radiation. The size(s) of the beam(s) illuminating portions of the structures are large enough to generate diffraction signals by the structures. These diffraction signals are caused to interfere leading to the detection of optical phase which is a measurement of the misalignment between the structures. The misalignment may then be used to control lithographic instruments such as a lithographic stepper or to determine whether or not the patterns of the structures are correctly placed and will yield functional devices.

When the paths of radiation traveling between the radiation source, the structures and detectors are close together, the phase sensitive detection is less sensitive to environmental factors such as vibration and thermal drifts. Since the system employs larger spot illumination, the optics of the system are less sensitive to focus accuracy. The system is compact and readily integratable with process equipment. Due to the enhanced sensitivity compared to conventional systems, the system is able to detect misalignment of periodic structures that are low contrast.

BRIEF DESCRIPTION OF THE DRAWINGS

FIG. 1 is a top view of two overlay targets placed next to each other that are illuminated by two corresponding radiation beams to illustrate the invention.

FIG. 2 is a perspective view of two overlay targets placed side-by-side and a Wollaston prism useful for illustrating the invention.

FIGS. 3A and 3B are side views from different angles of an overlay target metrology system illustrating an embodiment of the invention. FIG. 3C is a perspective view of the system of FIGS. 3A and 3B.

FIG. 4 is a flow diagram illustrating cross-sectional light distributions at various positions in the paths of radiation beams in the system of FIGS. 3A and 3B.

FIG. 5 is a schematic view of the Wollaston prism of FIGS. 3A and 3B illustrating its function in dividing a beam of radiation into two beams.

FIG. 6 is a graphical plot of output signals from the detectors of FIGS. 3A and 3B to illustrate a method for obtaining offset or misalignment information between the overlay targets from the detector outputs.

FIG. 7A is a schematic view of a conventional Wollaston prism dividing an input polarized beam into two polarized beams useful for illustrating the invention.

FIG. 7B is a schematic view of a modified Wollaston prism dividing an input polarized beam into two, useful for illustrating the invention.

FIG. 8A is a partially schematic and partially cross-sectional view of a dual heterodyne differential phase metrology system for measuring misalignment of two adjacent overlay targets to illustrate a preferred embodiment of the invention.

FIG. 8B is a partially schematic and partially cross-sectional view of a dual heterodyne differential phase metrology system for measuring misalignment of two adjacent overlay targets to illustrate an embodiment of the invention similar to that of FIG. 8A in many respects.

FIG. 9A is a cross-sectional view of a metrology system for measuring misalignment of overlay targets to illustrate another embodiment of the invention.

FIG. 9B is a graphical plot of the output signals from the metrology system of FIG. 9A FIG. 9C is a perspective view of the system of FIGS. 9A and 9B.

FIG. 10 is a top view of two overlay targets placed adjacent to each other illuminated by a single beam of radiation to illustrate yet another embodiment of the invention.

FIGS. 11A and 11B are two side views from different angles of a metrology system where a single beam of radiation is employed to illuminate two overlay targets for detecting misalignment illustrating yet another embodiment of the invention.

FIG. 12 is a flow diagram illustrating the cross-sectional light distributions at various positions of radiation beams in the system of FIGS. 11A and 11B.

FIG. 13 is a flow diagram illustrating the cross-sectional light distributions at various positions of radiation beams in the system of FIGS. 3A and 3B where the two overlay targets are periodic in two orthogonal directions.

FIG. 14 is a block diagram illustrating a lithographical instrument in combination with a metrology system for measuring misalignment of overlay targets to illustrate still another embodiment of the invention.

For simplicity of description, identical components are labeled by the same numerals in this application.

DETAILED DESCRIPTION OF THE EMBODIMENTS

FIG. 1 is a top view of two periodic structures 22, 24 such as overlay targets placed side-by-side, where both structures are illuminated by a beam of radiation having a round cross-section as shown in FIG. 1. Preferably both structures 22, 24 have the same period $\Lambda$, and are preferably aligned so that they are periodic substantially along the same line of direction X in the XY coordinate system. The two illuminated spots 26, 28 are preferably aligned with the centers of the spots substantially aligned along the Y axis. This can be achieved, for example, by aligning the two spots with two markers on one of the overlay target structures to correctly position the two spots. The size of spot 26 along the X axis is such that its dimension along the X axis is at least equal to or greater than the period $\Lambda$ (more typically equal to or greater than several periods $\Lambda$'s) in order for a diffracted signal to be generated by illuminating structure 22 at spot 26. Preferably, spot 26 would span a number of grating lines 22a of structure 22. The same can be said of spot 28 with respect to the period $\Lambda$ and other features of structure 24.

A metrology system 30 for generating the two illuminated spots 26, 28 on the two corresponding structures is illustrated in FIG. 2. As shown in FIG. 2, a beam of radiation (not shown) may be split by means of a Wollaston prism 32 to illuminate the two structures 22 and 24. As shown in FIG. 2, the Wollaston prism is located above the two structures at a predetermined z height above the structures.

FIGS. 3A and 3B are side views of the metrology system 30 of FIG. 2 in directions along the arrows 3A, 3B in FIG. 2, respectively. FIG. 3C is a perspective view of system 30. As shown in these figures, a beam of radiation 34 is split by prism 32 into two beams 34a, 34b in the Y direction. These two beams are collected by lens 36 towards two overlay target structures 22, 24 which are placed side-by-side above a substrate 38 such as a silicon wafer. Beam 34a illuminates spot 26 on structure 22 and beam 34b illuminates spot 28 of structure 24. Beam 34a is diffracted by structure 22. The zeroth-order diffraction retraces the original path of beam 34a and through prism 32. The first order diffraction 40a– and 40a+ from structure 22 of beam 34a are collected by lens 36 towards prism 32 and reflected by mirrors 44 and 46 towards two detectors 52, 54 as shown in FIG. 3B. Similarly, the zeroth-order diffracted signal from structure 24 of beam 34b retraces the original path of beam 34b. The first order diffracted signals 42b+ and 42b– are collected by lens 36 through prism 32 to the two detectors 52, 54. The relative positions of the various beams of radiation in FIGS. 3A and 3B are shown more clearly in the flow diagram of FIG. 4. The outputs of detectors 52, 54 are $S_{-1}$ and $S_{+1}$, respectively, as shown in FIG. 3B. As shown in FIG. 4, the input beam 34 is applied to Wollaston prism 32 which splits or divides the beam into two beams 34a, 34b when it reaches the objective 36. After passing through the objective, the two beams 34a, 34b illuminate, respectively, spots 26, 28 of structures 22, 24. To simplify the figures, the zeroth-order diffracted signal from the two structures have been omitted from FIG. 4. The positive and negative diffracted signals 40a+ and 40a– are collected by lens 36. Similarly, the positive and negative first diffraction signal 42b+ and 42b– are collected by lens 36 towards prism 32. Prism 32 combines beams 40a+ and 42b+ from the two spots 26, 28 into one beam towards detector 54. The input beam 34 is coherent so that beams 34a, 34b are coherent after passing prism 32. Therefore, the positive first order diffraction 40a+ and 42b+ are also coherent. They would, therefore, interfere when combined by prism 32 and at detector 54. Similarly, the negative first order diffracted signals 40a– and 42b– are combined by prism 32 and interfere at the prism and at the detector 52. The phase difference between the outputs of the two detectors 52, 54 is determined. This phase difference indicates the phase difference between beams 40a+, 42b+ and that between the pair of beams 40a– and 42b–, and provides information concerning misalignment between the two structures 22, 24. The two output signals $S_{+1}$ and $S_{-1}$ are shown in Equations 1 and 2 below:

$$S_{+1} \alpha \{\eta_{+1}^{a} + \eta_{+1}^{b} + 2\sqrt{\eta_{+1}^{a}\eta_{+1}^{b}} \cos(\phi_{+1} + \phi_{w} + \phi_{z} + \phi_{x})\} \quad (1)$$

$$S_{-1} \alpha \{\eta_{-1}^{a} + \eta_{-1}^{b} + 2\sqrt{\eta_{-1}^{a}\eta_{-1}^{b}} \cos(\phi_{-1} + \phi_{w} + \phi_{z} - \phi_{x})\} \quad (2)$$

In the equations (1) and (2) above, $\eta_{+1}^{a}$ is the diffraction efficiency of the diffracted signal 40a+ from interaction between structure 22 and beam 34a at spot 26, $\eta_{+1}^{b}$ the diffraction efficiency of the +1 diffracted signal 42b+ from interaction between structure 24 and beam 34b at spot 28, $\eta_{-1}^{a}$ the diffraction efficiency of the diffracted signal 40a– from interaction between structure 22 and beam 34a at spot 26, and $\eta_{-1}^{b}$ the diffraction efficiency of the –1 diffracted signal 42b– from interaction between structure 24 and beam 34b at spot 28. The phase terms $\phi_{+1}$ and $\phi_{-1}$ are residual phase differences due to the grating property difference and are defined by the equations below:

$$\phi_{+1} = \phi_{+1}^{a} - \phi_{+1}^{b};$$

$$\phi_{-1} = \phi_{-1}^{a} - \phi_{-1}^{b}$$

where $\phi_{+1}^{a}$ and $\phi_{-1}^{a}$ are the phase terms in the positive and negative diffracted signals, where such phase terms depend on the material and other properties of structure 22; and $\phi_{+1}^{b}$ and $\phi_{-1}^{b}$ are the phase terms in the positive and negative diffracted signals, where such phase terms depend on the material and other properties of structure 24. The two phase differences $\phi_{+1}$ and $\phi_{-1}$ are identical for +1 and –1 orders if the grating profile is symmetric. The term $\phi_{x}$ is the phase difference caused by any misalignment $\Delta x$ between the two periodic structures 22, 24 as set forth in equation (3) below. The amount of this phase shift is readily determined from the shifting theorem of Fourier transform. The grating with period Λ in frequency domain has a spatial frequency at 1/Λ. A phase shift Δx in space translates into $2\pi (1/\Lambda)\Delta x$ phase shift in frequency domain, directly predicted by shifting theorem. The term $\phi_x$ is the phase difference between the two detector outputs caused by the height difference Δz between the two structures 22, 24 as shown in equation (4) below. The term $\phi_w$ is the phase difference between the two detector outputs caused by phase shift induced by the Wollaston prism 32 as shown in equation (5) below.

$$\phi_x = \frac{2\pi}{\Lambda}\Delta x \tag{3}$$

$$\phi_z = \frac{2\pi}{\lambda}n\Delta z \tag{4}$$

$$\phi_w = \frac{2\pi}{\lambda}(n_o - n_e)\Delta h \tag{5}$$

where Λ is the grating period of structures 22, 24; n the average index of refraction of material 39; $n_o$, $n_e$ the indices of refraction for the ordinary and extraordinary rays of the prism 32; λ the wavelength of beam 34, and Δh is defined below.

FIG. 5 is a schematic view of the Wollaston prism 32 of FIGS. 3A, 3B illustrating its function in dividing a beam of radiation into two beams and the phase shift introduced by the prism. As shown in FIG. 5, beam 34 is split by prism 32 into two beams 34a, 34b with an angle θ in between them, where θ is given by equation (6) below. The phase difference caused by prism 32 between the two detector outputs $S_{+1}$ and $S_{-1}$ is given by equation (7) below, where $n_0$ and $n_e$ are the refractive indices of prism 32 in the ordinary and in the extraordinary directions of the prism. The term Δh in equation (5) above is the optical path length difference between h1 (the optical path length of beam 34 in prism 32 before reaching the optical interface 32a) and h2 (the optical path length of beams 34a and 34b through the prism after the interface 32a). When prism 32 is moved along the y direction relative to beam 34, beam 34 will reach the interface 32a of prism 32 at a different position, thereby changing the optical path lengths h1, h2 and also changing the quantity Δh. Δh is proportional to the distance y traveled by prism 32 as set forth below:

$$\Delta h = 2y\alpha$$

where α is the angle the optical interface 32a makes with the sides of the prism through which the beams 34, 34a, 34b pass as shown in FIG. 5, so that equation (5) becomes equation (7) below.

$$\theta = 2\alpha(n_o - n_e) \tag{6}$$

$$\varphi_w = \frac{2\pi}{\lambda}2\alpha(n_o - n_e)y = \frac{2\pi}{\lambda}y\theta \tag{7}$$

where the origin of the Y axis is at the position where $h_1 = h_2$.

The separation δy between two spots on target is given by:

$$\delta y = 2f\tan\left(\frac{\theta}{2}\right) \tag{8}$$

where f is the objective focal length. For small angle θ, an approximation of this formula becomes:

$$\delta y = f\theta$$

Thus, by moving prism 32 along the y axis and thereby changing the value of y, the phase term $\phi_w$ changes as a function of y, which, in turn, causes the two detector outputs $S_{+1}$ and $S_{-1}$ to also change as a function of the displacement y of prism 32 along the y axis, as illustrated in FIG. 6. As noted above, if the grating profiles of structures 22, 24 are symmetric, $\phi_{+1}$ and $\phi_{-1}$ are identical. The phase term $\phi_z$ is the same for both detector outputs. Therefore, the phase difference between the two detector outputs $S_{+1}$ and $S_{-1}$ in FIG. 6 is caused only by the overlay target error in equation (3). In other words, the phase difference Δφ between the two detector outputs is given by $2\phi_x$ as indicated in equation (9) below:

$$\Delta\phi = 2\phi_x \tag{9}$$

wherein the phase difference between detector signals $S_{+1}$ and $S_{-1}$: twice overlay error. Therefore, by measuring the phase difference between the two detector outputs at different displacement values of y as indicated in FIG. 6, the misalignment Δx between the two structures 22, 24 can be determined from equations (3) and (9) and the grating period of structures 22, 24. This may be performed by a processing device 50 in FIG. 3B, where the device may simply be a microprocessor, or programmable logic or any other suitable processing device which can compute the misalignment Δx from the two outputs $S_{+1}$ and $S_{-1}$.

As a practical matter, normally Wollaston prisms are designed such that the optical axis 32b (shown in a YZ plane as shown in FIG. 7A) is parallel to the length L in one half and the optical axis 32c (shown in an XZ plane as shown in FIG. 7A) is perpendicular to the length in the other half of the prism, where the two halves are separated by optical interface 32a, so that the two beams 34a, 34b will be either parallel polarized or orthogonally polarized with respect to the grating fingers of structures 22, 24. The two different polarizations of the two beams have different diffraction efficiencies. This can cause an imbalance in amplitude between the two outputs $S_{-1}$ and $S_{+1}$. This tends to limit the sensitivity of system 30 for a given bandwidth. It is possible to overcome this problem by rotating the prism by 45°, so that the polarization direction 34c is at 45° to the optical axis 32b, and so that the polarizations of the two beams 34a, 34b will be at +45 and −45° respectively with respect to the grating fingers of the two structures as shown in FIG. 7A. However, that rotates the spot on the sample, and results in a signal even in the absence of any misalignment. The offset can be cancelled through calibration; however, this requires a target with larger footprint.

Another solution is to use a modified Wollaston prism 32', in which the optical axis 32b' (shown in a YZ plane as shown in FIG. 7B) in the first half of the prism is at +45° with respect to the length L of the prism 32' and the optic axis 32c' (also shown in a YZ plane as shown in FIG. 7B) is at −45° to the length in the other half of prism 32' on the other side of interface 32a' as shown in FIG. 7B. If the incoming beam 34 is vertically polarized (as indicated by line 34c' in FIG. 7B), it will be split by the prism into two substantially equal amplitude beams 34a', 34b', each at 45° polarization with respect to the fingers of the gratings 22, 24 and giving substantially the same reflectance for substantially identical gratings. At the same time, the center line of the two spots will then be parallel to the fingers of the gratings as desired.

Any residual difference in diffraction efficiencies of the two gratings can still be balanced by tuning the incoming polarization, using, for example, a half-wave plate.

Instead of having to move the Wollaston prism as described above, an alternative differential heterodyne system 100 requiring no moving parts is possible; this is illustrated in FIG. 8A as another embodiment. As shown in FIG. 8A, a coherent beam of radiation 102 is split into two beams 102a and 102b by polarizing beamsplitter 104. Half wave plate 101 is employed to control the intensity ratio between $E_1$ and $E_2$ to compensate for the diffraction efficiency differences between the two overlay targets 22, 24. Beam 102a is frequency shifted upwards by modulator 106 by frequency $\omega_1$ to become beam $E_1$ and beam 102b is frequency shifted upwards by a modulator 108 by frequency $\omega_2$ to become beam $E_2$. The two modulated beams are reflected by mirrors 110 and passed through respective wave plates 112a, 112b so that $E_1$ and $E_2$ can pass through and be reflected respectively by the polarizing beam splitter 114. The two beams pass through beamsplitter 116 to a birefringent element such as a Wollaston prism 32 which separates the two beams $E_1$ and $E_2$ on account of their different polarizations. Beam $E_1$ is collected by lens 36 towards structure 24 and beam $E_2$ is collected by the lens towards structure 22.

The +1 diffraction order $E_{1,+1}$ of beam $E_1$ from structure 24 is focused by lens 36 towards prism 32. The +1 diffraction order $E_{2,+1}$ of beam $E_2$ from structure 22 is also focused by lens 36 and combined with the +1 diffraction order $E_{1,+1}$ by prism 32 into a single beam which is reflected by beamsplitter 116. The polarizations of the fields $E_{1,+1}$, $E_{2,+1}$ are orthogonal to each other. Analyzer 118 is placed at substantially 45° to the polarization directions of $E_{1,+1}$, $E_{2,+1}$ so that the components passed by the analyzer have the same polarization and will interfere at detector 54, after reflection by mirror 134. Similarly, the −1 diffraction order signals $E_{1,-1}$, $E_{2,-1}$ of the respective beams $E_1$, $E_2$ by structures 24, 22, respectively, are focused by lens 36 towards the same spot in prism 32 which combines the two beams into a single beam $E_{1,-1}+E_{2,-1}$. Again the components of $E_{1,-1}$, $E_{2,-1}$ passed by the analyzer 118 have the same polarization and will interfere at detector 52, after reflection by mirror 132. The outputs of the detectors 52, 54 are then provided to a phase detector 140 which detects a beat frequency $\omega_b$ which is equal to the difference between $\omega_1$ and $\omega_2$ in order to determine the misalignment or overlay target error $\Delta x$. The equations of the various optical signals $E_1$, $E_2$, $E_{1,+1}$, $E_{2,+1}$, $E_{1,-1}$, $E_{2,-1}$ are set forth below. In the equations below, $|E_1|$, $|E_2|$ are the amplitudes of the two beams $E_1$ and $E_2$ and $\omega_0$ is the frequency of input beam 102. The terms $\theta_{n1}$ and $\theta_{n2}$ indicate the initial phase of input beam 102 and also the optical path length difference of the two beams between beamsplitter 104 and polarizing beamsplitter 114. The terms $\phi_{+1}$, $\phi_{-1}$, $\phi_x$, $\phi_z$, and $\phi_w$ have the same meanings as those described above in the previous embodiment where the Wollaston prism is moved, and are set forth in equations (3)–(5) above.

$$E_1 = |E_1|\exp\{j(\omega_0 t + \omega_1 t + \theta_{n1})\} \quad (10)$$

$$E_2 = |E_2|\exp\{j(\omega_0 t + \omega_2 t + \theta_{n2})\} \quad (11)$$

$$E_{1,+1} = |E_1|\sqrt{\eta_{+1}^b}\exp\{j(\omega_0 t + \omega_1 t + \theta_{n1} + \phi_{+1}^b + \phi_x)\} \quad (12)$$

$$E_{1,-1} = |E_1|\sqrt{\eta_{-1}^b}\exp\{j(\omega_0 t + \omega_1 t + \theta_{n1} + \phi_{-1}^b - \phi_x)\} \quad (13)$$

$$E_{2,+1} = |E_2|\sqrt{\eta_{+1}^a}\exp\{j(\omega_0 t + \omega_2 t + \theta_{n2} + \phi_{+1}^a + \phi_z + \phi_w)\} \quad (14)$$

$$E_{2,-1} = |E_2|\sqrt{\eta_{-1}^a}\exp\{j(\omega_0 t + \omega_2 t + \theta_{n2} + \phi_{-1}^a + \phi_z + \phi_w)\} \quad (15)$$

The quantities $\sqrt{\eta_{+1}^b}$, $\sqrt{\eta_{+1}^a}$, $\sqrt{\eta_{-1}^b}$, $\sqrt{\eta_{-1}^a}$ are the diffraction efficiencies of the two structures for the +1 and −1 diffraction in the equations above. The output of detector 54 is given by equation (16) below and the output of detector 52 is given by equation 17 below.

$$S_{+1} \propto |E_{1,+1} + E_{2,+1}|^2 = |E_1|^2\eta_{+1}^b + |E_2|^2\eta_{+1}^a + 2|E_1||E_2|\sqrt{\eta_{+1}^a\eta_{+1}^b} \quad (16)$$
$$\cos[\omega_b t + (\theta_{n2} - \theta_{n1}) + (\phi_{+1}^a - \phi_{+1}^b) + \phi_z + \phi_w - \phi_x]$$

$$S_{-1} \propto |E_{1,-1} + E_{2,-1}|^2 = |E_1|^2\eta_{-1}^b + |E_2|^2\eta_{-1}^a + 2|E_1||E_2|\sqrt{\eta_{-1}^a\eta_{-1}^b} \quad (17)$$
$$\cos\{\omega_b t + (\theta_{n2} - \theta_{n1}) + (\phi_{-1}^a - \phi_{-1}^b) + \phi_z + \phi_w + \phi_x\}$$

$S_{+1}$ and $S_{-1}$ are sinusoidal functions at the beat frequency or difference frequency $\omega_b = \omega_1 - \omega_2$ in the time domain. Again, where the two structures 22, 24 are symmetric, the following phase relation would hold:

$$\phi_{+1}^a = \phi_{-1}^a$$
$$\phi_{+1}^b = \phi_{-1}^b \quad (18)$$

Thus, from equations (16)–(18) above, it is noted that the phase difference between $S_{+1}$ and $S_{-1}$, is $2\phi_x$.

Therefore, by detecting the phase difference between the two detector outputs, the overlay target error $\Delta_x$ between the two structures 22, 24 may be obtained from equations (3) and (9) above.

Advantageously, the detector 140 may be set to detect at the beat or difference frequency $\omega_1 - \omega_2$ to improve the signal-to-noise ratio of $\phi_x$.

From a comparison of FIG. 8A to FIGS. 3A, 3B, it will be evident that the two diffracted and combined beams $E_{1,+1} + E_{2,+1}$ and $E_{1,-1} + E_{2,-1}$ as well as their corresponding detectors 54, 52 are not in the plane of the paper; instead, one combined beam and its corresponding detector are above the plane of the paper and the other combined beam and its corresponding detector are in the plane below the plane of the paper.

FIG. 8B is a partially schematic and partially cross-sectional view of a dual heterodyne differential phase metrology system for measuring misalignment of two adjacent overlay targets to illustrate another embodiment of the invention analogous to that in FIG. 8A. As shown in FIG. 8B, metrology system 100' is similar to system 100 on FIG. 8A, except that a non-polarizing beamsplitter 114' is used instead of the polarizing beamsplitter 114 of FIG. 8A. Waveplate 101 is again used for controlling the intensity in ratio between the two beams $E_1$ and $E_2$.

The typical heterodyne phase different $\phi_x$ detected is of the order of $10^{-4}$ radians where the spacing $\Lambda$ of structures 22, 24 is of the order of 2 microns in equation (3) above. Therefore, with such or similar grating period of structures 22, 24, it is possible to detect misalignment $\Delta x$ which can be as small as 30 picometers.

FIGS. 9A and 9C illustrate another embodiment of the invention without any moving parts. FIG. 9B is a graphical plot of the output signals from the metrology system of FIGS. 9A, 9C. As shown in FIGS. 9A, 9C, a portion of an input coherent beam of radiation 102 at frequency $\omega_0$ is reflected by mirror 202 and passes through an acoustooptic deflector (AOD) 204. A portion 212 of the input beam at frequency $\omega_0$ passes through the AOD without being deflected or changed in frequency and is collected by lens 36 towards structure 24. Another portion 214 of the input beam 102 is upshifted by frequency $\omega$ and is deflected by the AOD 204 to provide an upshifted and deflected beam at frequency $\omega_0 + \omega$ which is also collected by lens 36 towards structure 22.

Beam 214 is diffracted by structure 22 and the +1 and −1 orders of the diffraction are beams 214+ and 214−, respectively. The two diffracted beams 214+ and 214− are both at frequency $\omega_0+\omega$. The two diffracted beams 214+ and 214− are collected by lens 36 towards AOD 204 which passes without deflection or change in frequency a portion thereof towards mirror 208. The undeflected beam 212 at frequency $\omega_0$ is diffracted by structure 24 into two diffracted beams 212+ and 212−, both at frequency $\omega_0$. These two beams are collected by lens 36 towards the AOD 204 which deflects and downshifts in frequency by $\omega$ a portion of the two beams towards mirror 208. The AOD 204 combines the deflected portion of beam 212+ and the undeflected portion of beam 214+ to form the +1 order mixed output signal $S_{+1}'$ so that the two portions would interfere and yield an output at beat frequency equal to $2\omega$. Similarly, AOD 204 would combine the deflected portion of beam 212− and the undeflected portion of beam 214− as the −1 order mixed signal output $S_{-1}'$ at beat frequency $2\omega$.

As in the previous embodiment shown in FIGS. 8A, 8B, any misalignment between the two structures 22, 24 in the X direction would introduce a phase difference $\phi_x$, between the +1 order ($S_{+1}$) and the −1 order ($S_{-1}$) of mixed outputs in FIG. 9C. Thus, equations 16–18 may then be used to derive the overlay target area $\Delta_x$, where the beat frequency $\omega_b$ in equations 16 and 17 is equal to $2\omega$.

FIG. 10 is a schematic view of the two structures 22, 24 illuminated by a single beam to illustrate another embodiment of the invention. Thus, instead of splitting single beam into two beams, for illuminating the two respective structures, a single beam may be used. FIGS. 11A, 11B are the front and side views of a system 300 employing a single beam for illuminating the two structures to illustrate yet another embodiment of the invention. As shown in FIGS. 10, 11A, 11B, this embodiment is analogous to that shown in FIGS. 2, 3A and 3B, except that a single beam 302 is employed that illuminates both structures 22, 24. As shown in FIGS. 10 and 11A, the single beam 302 illuminates a portion of structure 22 and a portion of structure 24 at their edges next to each other. The +1 and −1 diffraction signals from the two structures are collected by lens 36 and combined and detected by two detectors (not shown) to provide the two outputs $S_{+1}$ and $S_{-1}$ as in the embodiment of FIGS. 2, 3A and 3B. A flow diagram illustrating the relative positions of the beams are shown in FIG. 12. As shown in FIG. 12 the +1 diffraction beams from structures 22, 24 are combined into a single beam 340 and the −1 diffraction beams from the two structures are combined into a single beam 342. The two beams are detected by respective detectors 52, 54 to provide the output $S_{+1}$ and $S_{-1}$ as before.

One consideration in the embodiment of FIGS. 10, 11A, 11B and 12 is that the alignment of the illuminating beam 302 is preferably controlled relative to the two structures to ensure that the relative intensity of the diffraction beams from both structures are held stable and substantially equal. This can be accomplished by precision beam positioning relative to the patterning on the wafer which can be augmented using an imaging system such as an optical microscope to visualize the beam location and make fine adjustments to the location of the beam 302. Other methods include measuring the relative intensity of the diffraction components from the two structures in a feedback system to move the beam 302 to even and consistent alignment between the two structures. For such alignment, the wafer may be moved by means of cross-roller translation stages driven by micrometers. Alternatively, beam 302 may be moved by means of adjustable beam steering mirrors or galvanometer mirrors and the like. All such different alignment mechanisms are believed to be known to those skilled in the art.

In the embodiments described above, misalignment is detected along one direction, namely, the x direction. In order to discover misalignment along an orthogonal direction such as the y direction, typically a second optical detection system is employed. Yet another embodiment envisions a two-dimensional alignment system as illustrated in FIG. 13. For this purpose a pair of two-dimensional gratings C and D is created and positioned on their respective processing layers in the same manner as the previously described structures 22, 24. In the case of a dual beam measurement configuration described above in reference to FIGS. 2, 3A, 3B and 4, the two illumination beam on the two gratings would each give rise to four principal diffraction components, two in each axis of the gratings C and D.

Aside from the use of two-dimensional gratings C and D instead of one-dimensional gratings 22, 24, and the need to detect four outputs instead of two, the apparatus for the embodiment of FIG. 13 is the same as the previous embodiment illustrated in reference to FIGS. 2, 3A, 3B and 4. The two quartets of diffraction orders from gratings C and D are brought into alignment by the Wollaston prism 32 and four separate photodetectors 352, 354, 356 and 358 are used to separately measure the two sets of interference signals corresponding to the positive and negative diffraction orders in each of the two axes. Conveniently, the detector used in this configuration may be a quadrant photodiode. Interpretation of the phase information proceeds as before and alignment information in two axes may be simultaneously derived. The misalignment along the y direction is determined by calibration based on two targets on the same layer to offset the DC phase shift induced by the Wollaston prism for the diffraction in the y direction.

FIG. 14 is a block diagram illustrating a lithographic instrument 400 in combination with a metrology system 100 for measuring misalignment of overlay targets to illustrate still another embodiment of the invention. As shown in FIG. 14, the misalignment between two overlay targets measured by the metrology system 100 of FIG. 8A may be supplied to lithographic instrument 400 for controlling a lithographic process, such as one performed by a lithographic stepper. Thus, the metrology system 100 may be integrated with instrument 400 to become an integrated system for the convenient operation of misalignment detection and lithographic process control. Alternatively misalignment information may be used to determine probable device yield, and to make decision about future processing or rework of the devices. The process for performing such yield analysis and management is known to those skilled in the art so that no details need to be provided herein. This can also be done by supplying the misalignment of overlay targets information to instrument 400, where the instrument is equipped with yield analysis and management capability residing in a microprocessor in the instrument 400, in addition to lithographic control. Alternatively, such capability may reside in processing device or processor 50.

While the invention has been described above by reference to various embodiments, it will be understood that changes and modifications may be made without departing from the scope of the invention, which is to be defined only by the appended claims and their equivalents.

What is claimed is:

1. A method for detecting misalignment of two periodic structures placed next to each other so that they are periodic substantially along a first line, comprising:

illuminating a portion of each of the two structures using radiation that is substantially coherent so that the radiation propagates along paths towards the structures and zeroth-order diffraction of the radiation by the structures retraces such paths after diffraction by the structures, each of said portions having a dimension along the first line larger than the period of the corresponding structure;

detecting diffracted radiation signals from the illuminated portions of the structures to provide at least one output signal; and determining from the at least one output signal a misalignment between the structures.

2. The method of claim 1, further comprising dividing a substantially coherent beam of radiation into a first and a second beam that are substantially coherent, wherein said illuminating employs radiation from the first beam to illuminate one of the structures and radiation from the second beam to illuminate the other structure.

3. The method of claim 2, wherein said dividing includes passing said substantially coherent beam of radiation to a birefringent or acoustooptic element.

4. The method of claim 3, further comprising modulating the first beam at a first frequency before radiation from the first beam is employed to illuminate said one of the structures.

5. The method of claim 2, further comprising modulating the second beam at a second frequency before radiation from the second beam is employed to illuminate said other one of the structures.

6. The method of claim 5, wherein said detecting detects at a frequency that is proportional to a difference between the first and second frequencies, or between multiples thereof.

7. The method of claim 5, wherein said modulating includes splitting said coherent beam into a third and a fourth beam, modulating the third and fourth beams by different frequencies and combining the modulated third and fourth beam into a combined beam.

8. The method of claim 7, wherein said splitting into the third and fourth beams employs a polarizing beam splitter.

9. The method of claim 7, wherein said combined beam is substantially coherent and is divided into said first and second beams by the dividing.

10. The method of claim 1, wherein said illuminating uses radiation that contains a component at a second frequency, and said detecting detects at a frequency that is proportional to a difference between and/or sum of the first and second frequencies, or a difference between and/or sum of multiples thereof.

11. The method of claim 2, further comprising:
combining the diffracted radiation signals from the illuminated portions of the two structures; and
supplying the combined diffracted radiation signals to one or more detectors.

12. The method of claim 11, wherein said dividing or combining employs a birefringent or acoustooptic element.

13. The method of claim 12, further comprising causing relative motion between the element and the structures when the diffracted radiation signals from the illuminated portions of the structures are detected, and wherein said determining includes calculating a phase difference between the diffraction radiation signals that are detected from the two structures when said relative motion is caused.

14. The method of claim 11, wherein said combining combines first order diffraction signals from the two structures.

15. The method of claim 14, wherein said combining combines a positive first order diffraction signal from one of the two structures with a positive first order diffraction signal from the other of the structure and combines a negative first order diffraction signal from one of the two structures with a negative first order diffraction signal from the other of the structure.

16. The method of claim 1, further comprising causing a change in the relative phase between radiation illuminating one of the two structures and radiation illuminating the other of the two structures, or between the diffracted radiation signals from one of the two structures and the diffracted radiation signals from the other of the two structures.

17. The method of claim 1, wherein said illuminating employs a single beam to illuminate the two portions of the two structures, with a part of the beam illuminating the portion of one structure, and another part of the beam illuminating the portion of the other structure.

18. The method of claim 1, wherein said two periodic structures are also periodic substantially along a second line transverse to the first line, and wherein said determining determines misalignments between the structures along the first and second lines.

19. A apparatus for detecting misalignment of two periodic structures placed next to each other so that they are periodic substantially along a first line, comprising:
a source providing a radiation beam that is substantially coherent to illuminate a portion of each of the two structures so that the radiation propagates along paths towards the structures and zeroth-order diffraction of the radiation by the structures retraces such paths after diffraction by the structures, each of said portions having a dimension along the first line larger than the period of the corresponding structure;
two or more detectors, each detector detecting a diffracted radiation signal from the illuminated portion of each structure to provide an output signal; and
a processor determining from said output signals any misalignment between the structures.

20. The apparatus of claim 19, further comprising a first device dividing a substantially coherent beam of radiation into a first and a second beam that are substantially coherent, wherein radiation from said first beam illuminates one of the structures and radiation from the second beam illuminates the other of the structures.

21. The apparatus of claim 20 wherein said first device is a birefringent or acoustooptic element.

22. The apparatus of claim 21, further comprising an instrument that causes the first device to move along a second direction substantially normal to the first line when said at least one detector detects the diffracted signals, and wherein said processor calculates a phase difference between the output signals provided by the two or more detectors when said relative motion is caused.

23. The apparatus of claim 20, wherein said first device comprises a Wollaston prism that has an optical axis at an angle of about 45° to one side of the prism.

24. The apparatus of claim 20, further comprising a second device combining the diffracted radiation signals from the illuminated portions of the two structures and supplying the combined diffracted radiation signals to the detectors.

25. The apparatus of claim 24, wherein said first or second device includes a common birefringent or acoustooptic element.

26. The apparatus of claim 25, further comprising an instrument causing relative motion between the element and the structures when the diffracted radiation signals from the illuminated portions of the structures are detected, and wherein said process or includes calculating a phase difference between the output signals when said relative motion is caused.

27. The apparatus of claim 24, wherein said second device combines first order diffraction signals from the two structures.

28. The apparatus of claim 27, wherein said second device combines a positive first order diffraction signal from one of the two structures with a positive first order diffraction signal from the other of the structure and combines a negative first order diffraction signal from one of the two structures with a negative first order diffraction signal from the other of the structure.

29. The apparatus of claim 19, further comprising an instrument that causes a change in the relative phase between radiation illuminating one of the two structures and radiation illuminating the other of the two structures, or between the diffracted radiation signals from one of the two structures and the diffracted radiation signals from the other of the two structures.

30. The apparatus of claim 20, further comprising a first modulator modulating the first beam at a first frequency before radiation from the first beam is employed to illuminate said one of the structures.

31. The apparatus of claim 30, further comprising a second modulator modulating the second beam at a second frequency before radiation from the second beam is employed to illuminate said other one of the structures.

32. The apparatus of claim 31, further comprising a phase detector detecting the outputs at a frequency that is proportional to a difference between the first and second frequencies, or between multiples thereof.

33. The apparatus of claim 30, further comprising a second device that splits said coherent beam into the first and second beams, and combines the modulated first and second beams into a combined beam.

34. The apparatus of claim 33, wherein said second device includes a polarizing beam splitter.

35. The apparatus of claim 33, wherein said combined beam is substantially coherent and is divided into said first and second beams by the first device.

36. The apparatus of claim 19, wherein said radiation beam contains a component at a second frequency, and said detectors detect a frequency that is proportional to a difference between and/or sum of the first and second frequencies, or a difference between and/or sum of multiples thereof.

37. The apparatus of claim 19, wherein said source provides a single beam to illuminate the two portions of the two structures, with a part of the beam illuminating the portion of one structure, and another part of the beam illuminating the portion of the other structure.

38. The apparatus of claim 19, wherein said two periodic structures are also periodic substantially along a second line transverse to the first line, and wherein said processor determines misalignments between the structures along the first and second lines.

39. A method for controlling lithographical processing of substrates by detection of misalignment of two periodic structures placed next to each other so that they are periodic substantially along a first line, comprising:

illuminating a portion of each of the two structures using radiation that is substantially coherent so that the radiation propagates along paths towards the structures and zeroth-order diffraction of the radiation by the structures retraces such paths after diffraction by the structures, each of said portions having a dimension along the first line larger than the period of the corresponding structure;

detecting diffracted radiation signals from the illuminated portions of the structures to provide at least one output signal;

determining from the at least one output signal a misalignment between the structures; and adjusting a lithographical instrument in response to the misalignment.

40. The method of claim 39, wherein said adjusting adjusts a lithographical stepper.

41. A apparatus for controlling lithographical processing of substrates by detection of misalignment of two periodic structures placed next to each other so that they are periodic substantially along a first line, comprising:

a source providing a radiation beam that is substantially coherent to illuminate a portion of each of the two structures so that the radiation propagates along paths towards the structures and zeroth-order diffraction of the radiation by the structures retraces such paths after diffraction by the structures, each of said portions having a dimension along the first line larger than the period of the corresponding structure;

two or more detectors, each detector detecting a diffracted radiation signal from the illuminated portion of each structure to provide an output signal; and a lithographical instrument;

a processor determining from said output signals any misalignment between the structures and providing information concerning the misalignment to the lithographical instrument.

42. A method for providing yield information by detection of misalignment of two periodic structures placed next to each other so that they are periodic substantially along a first line, comprising:

illuminating a portion of each of the two structures using radiation that is substantially coherent so that the radiation propagates along paths towards the structures and zeroth-order diffraction of the radiation by the structures retraces such paths after diffraction by the structures, each of said portions having a dimension along the first line larger than the period of the corresponding structure;

detecting diffracted radiation signals from the illuminated portions of the structures to provide at least one output signal;

determining from the at least one output signal a misalignment between the structures; and providing yield related information in response to the misalignment.

43. A apparatus for providing yield related information by detection of misalignment of two periodic structures placed next to each other so that they are periodic substantially along a first line, comprising:

a source providing a radiation beam that is substantially coherent to illuminate a portion of each of the two structures so that the radiation propagates along paths towards the structures and zeroth-order diffraction of the radiation by the structures retraces such paths after diffraction by the structures, each of said portions having a dimension along the first line larger than the period of the corresponding structure;

two or more detectors, each detector detecting a diffracted radiation signal from the illuminated portion of each structure to provide an output signal; and one or more processors determining from said output signals any misalignment between the structures and providing yield related information.

44. The method of claim 2, wherein the illuminating illuminates less than each of the structures, so that the two illuminated portions are separated from each other and do not overlap.

45. The apparatus of claim 20, wherein the radiation from the first beam illuminates less than one of the structures, and the radiation from the second beam illuminates less than the other of the structures, and so that the two illuminated portions are separated from each other and do not overlap.

46. The apparatus of claim 41, wherein the radiation beam illuminates less than each of the structures, and so that the two illuminated portions are separated from each other and do not overlap.

47. The apparatus of claim 43, wherein the radiation beam illuminates less than each of the structures, and so that the two illuminated portions are separated from each other and do not overlap.

48. The method of claim 42, wherein the illuminating illuminates less than each of the structures, so that the two illuminated portions are separated from each other and do not overlap.

49. A method for detecting misalignment of two periodic structures on a sample surface and placed next to each other so that they are periodic substantially along a first line, comprising:

illuminating a portion of each of the two structures using radiation that is substantially coherent so that the radiation propagates towards the structures along paths substantially normal to the surface, each of said portions having a dimension along the first line larger than the period of the corresponding structure;

detecting diffracted radiation signals from the illuminated portions of the structures to provide at least one output signal; and determining from the at least one output signal a misalignment between the structures.

50. The method of claim 49, wherein the illuminating illuminates less than each of the structures, so that the two illuminated portions are separated from each other and do not overlap.

51. A apparatus for detecting misalignment of two periodic structures on a sample surface and placed next to each other so that they are periodic substantially along a first line, comprising:

a source providing a radiation beam that is substantially coherent to illuminate a portion of each of the two structures so that the radiation propagates towards the structures along paths substantially normal to the surface, each of said portions having a dimension along the first line larger than the period of the corresponding structure;

two or more detectors, each detector detecting a diffracted radiation signal from the illuminated portion of each structure to provide an output signal; and a processor determining from said output signals any misalignment between the structures.

52. The apparatus of claim 51, wherein the radiation beam illuminates less than each of the structures, and so that the two illuminated portions are separated from each other and do not overlap.

\* \* \* \* \*